_United States Patent_ [19]

Koch et al.

[11] Patent Number: 6,069,732
[45] Date of Patent: May 30, 2000

[54] SEMICONDUCTOR INTERFEROMETRIC OPTICAL WAVELENGTH CONVERSION DEVICE

[75] Inventors: Thomas Lawson Koch, Holmdel; Xing Pan, Matawan, both of N.J.

[73] Assignee: Lucent Technologies Inc., Murray Hill, N.J.

[21] Appl. No.: 08/880,057

[22] Filed: Jun. 20, 1997

Related U.S. Application Data

[63] Continuation of application No. 08/355,768, Dec. 14, 1994, abandoned.

[51] Int. Cl.[7] .............................. H04B 10/04; H01S 3/10
[52] U.S. Cl. .......................... 359/344; 359/160; 359/279
[58] Field of Search .................................. 359/134, 160, 359/183, 188, 279, 324, 344

[56] References Cited

U.S. PATENT DOCUMENTS

| | | | |
|---|---|---|---|
| 4,879,761 | 11/1989 | Webb | 455/601 |
| 4,957,337 | 9/1990 | Ogawa et al. | 385/3 |
| 5,111,333 | 5/1992 | Coles et al. | 359/333 |
| 5,249,243 | 9/1993 | Skeie | 359/279 |
| 5,264,960 | 11/1993 | Glance | 359/344 |
| 5,303,079 | 4/1994 | Gnauck et al. | 359/188 |
| 5,345,455 | 9/1994 | Gabriagues et al. | 359/326 |

FOREIGN PATENT DOCUMENTS

| | | | |
|---|---|---|---|
| 362789 | 4/1990 | European Pat. Off. | G02B 6/12 |

OTHER PUBLICATIONS

"Wavelength converter based on integrated all–active three–port Mach–Zehnder interferometer", M. Schilling et al., Electronics Letters, vol. 30, No. 25 Dec. 8, 1994, pp. 2128–2130.

"10 Gbit/s wavelength converter realised by monolithic integration of semiconductor optical amplifiers and Michelson interferometer", B. Mikkelsen, et al., 20th European Conference on Optical Communication (ECOC), vol. 4, Sep. 25, 1994 Florence, Italy, pp. 67–70.

"All optical wavelength conversion at 5 Gbit/s with monolithic integration of semiconductor optical amplifiers in a passive asymmetric Mach–Zehnder interferometer", N. Vodjdani et al., vol. 4, Sep. 25, 1994, Florence, Italy, 20th European Conference on Optical Communication (ECOC), pp. 95–98.

"All optical wavelength conversion by SOA's in a Mach–Zehnder configuration", IEEE Photonics Technology Letters, vol. 6, No. 1, Jan. 1994, New York, US, pp. 53–55 by T. Durhuus et al.

Mikkelsen, B. et al., "10Gbit/s Wavelength Converter . . . ", ECOC'94 Sep. 25–29, 1994, Firenze, Italy.

Vodjdani, N. et al. "All Optical Wavelength . . . ", ECOC'94, Sep. 25–29, 1994, Firenze, Italy.

Yasaka, H. et al., _Electronics Letter,_, Jan. 20, 1994, "Broad–Range Wavelength Conversion . . . ", vol. 30 , No. 2.

(List continued on next page.)

_Primary Examiner_—Nelson Moskowitz
_Attorney, Agent, or Firm_—Gregory C. Ranieri

[57] ABSTRACT

An interferometer having semiconductor optical amplifiers in one or both arms of the interferometer converts information from a first wavelength to another predetermined wavelength. The original data signal (at the first wavelength) is coupled into the interferometer in such a way that it is confined to propagate, either co-directionally or contra-directionally, in only one arm of the interferometer together with the lightwave signal at the predetermined wavelength. This arm includes the semiconductor optical amplifier. In this way, the original data signal is utilized effectively to maximize the interference effect, which is required for wavelength conversion, while minimizing the problems associated with simultaneously saturating amplifiers in the interferometer structure.

12 Claims, 3 Drawing Sheets

OTHER PUBLICATIONS

Schnabel, R., et al., "Polarization Insensitive Frequency...", *IEEE Photonics Tech.Ltrs.,* vol. 6, No. 1, Jan. 1994.

Zhou, J. et al., "Efficiency of Broadband Four–wave", *IEEE Photonics Tech.Ltrs.,* vol. 6, No. 1, Jan. 1994.

Durhuus, T., et al. "All Optical Wavelength Conversion . . . ", *IEEE Photonics Tech.Ltrs.,* vol. 6, No. 1, Jan. 1994.

Ebskamp, F. et al., "Integrated CPFSK Receiver Using . . . ", *ECOC'93,* Montreux, Switzerland, Sep. 12–16, 1993, vol. 3, p. 81–4.

Joergensen, C., et al. "Wavelength Conversion at 2.t Gbit/s . . . " *OAA'93,* Paper MD2, Yokohama, Japan, Jul. 1993.

Durhuus, T., et al., "2.5–Gb/s Optical Gating With High . . . ", *Conf.on Lasers & Electro–Optics,* May 2–7, 1993, Baltimore, MD.

Mikkelsen, B., et al., "Demostration of All–OpticalWavelength Conversion . . . ", *OFC/IOOC'93 Technical Digest,* Feb. 21–26, 1993, San Jose, CA.

Glance, B., et al., "High Performance Optical Wavelength . . . ", *Electronics Ltrs.,* Aug. 27, 1992, vol. 28, No. 18.

Young, M.G., et al. "A Compact 2X2 Amplifier Switch . . . ", *IEEE Photonics Tech. Ltrs.,* vol. 4, No. 9, Sep. 1992.

Wiesenfeld, J.M. et al., "Cascadability and Fanout of Semiconductor . . . ", *IEEE Photonics Tech. Ltrs.,* vol. 4, No. 10, Oct., 1992.

Durhuus, T., et al., "High–Speed All–Optical Gating . . . ", *Conf.On Lasers & Electro–Optics,* May 10–15, 1992, Anaheim, CA.

Barnsley, P.E. et al., "All–Optical Wavelength Switching . . . ", *IEEE Photonics Tech.Ltrs.,* vol. 4, No. 1, Jan. 1992.

Barnsley, P.E. et al. "Wavelength Conversion from 1.3 to 1.55 . . . " *IEEE Photonics Tech. Ltrs.,* vol. 3, No. 3, Mar. 1991.

Rokugawa, H., et al., "Error–Free Operation of Wavebx;1length . . . ", *Elec. Ltrs.,* vol., 24, No. 17, pp. 393–395, Feb. 1991.

Eisenstein, G., "Semiconductor Optical Amplifiers", *IEEE Circuits & Devices Magazine,* Jul. 1989, pp. 25–30.

Grosskopf, G., et al., "140 Mbit/s DPSK Transmission Using . . . ", *Electronics Letters,* Aug. 18, 1988, vol. 24, No. 17.

Inoue, K., "High–Speed All–Optical Gate Switching . . . ", *Electronic Letters,* Jul. 1987, vol. 23, pp. 911–912.

Inoue, K., et al., "Gain Saturation Dependence On Signal . . . ", *Electronics Letters,* Mar. 26, 1987, vol. 23, No. 7, 328–329.

Rakausky et al, Izv. Ross. Akad. Wauk, Ser. Fig. (Review), Sep. 1991, vol. 56, #10, pp. 1635–1640, Abst. herewith.

Kravtsav et al, Sou. Phys. –Tech. Phys., vol. 25, #1, p. 108, Jan. 1980; Abst. only herewith.

SEMICONDUCTOR INTERFEROMETRIC OPTICAL WAVELENGTH CONVERSION DEVICE

This application is a continuation of application Ser. No. 08/355,768, filed on Dec. 14, 1994, now abandoned.

TECHNICAL FIELD

This invention relates to semiconductor devices and, more particularly, to such devices which perform wavelength conversion of optical signals so that information included in an optical signal at one wavelength is effectively transferred in a representative form to an optical signal at another wavelength.

BACKGROUND OF THE INVENTION

Optical devices such as wavelength shifters and wavelength converters have been used to "change the wavelength" of an optical data signal. This change in the wavelength is more properly exemplified as a transfer of data or information from a carrier signal at a first wavelength to a different carrier signal at a second wavelength.

Wavelength shifters or converters are applicable to lightwave transmission networks as such networks employ wavelength division multiplexing and wavelength routing of optical signals. These devices help to overcome the capacity limitations of such networks by rearranging (wavelength channel interchange) and reallocating the optical wavelength channels for efficient use of the limited optical bandwidth of the network.

Optical wavelength conversion has been demonstrated by using a traveling wave semiconductor optical amplifier which performs the conversion on intensity modulated optical signals by employing either four-wave mixing or the gain saturation effect. These devices suffer from a common shortcoming. The signal extinction ratio on the converted signal and/or the conversion efficiency are neither very high nor attractive over a wide range of wavelengths without the expenditure of relatively high input signal power.

Semiconductor optical amplifiers have been used more recently in both Mach-Zehnder and Michelson interferometers to provide wavelength conversion. Amplifiers were arranged in both arms of each interferometer. These configurations exploit the phase shift caused by the refractive index variation associated with gain saturation in the optical amplifiers. As such, the interferometers transfer attendant phase modulation into an amplitude (intensity) modulated signal. This technique apparently operates at low power while improving the signal quality of the converted signal with respect to extinction ratio and chirp.

SUMMARY OF THE INVENTION

We have discovered certain shortcomings in both of the latter configurations of wavelength conversion devices. The shortcomings identified by us are a need for output filtering and inefficient use of the information signal for saturation so that the interference effect is diminished.

In these configurations, both the original data signal and the wavelength converted signal emerge at the same output port of the device. This creates a requirement to filter the device output so that the original data signal can be eliminated and the wavelength converted signal can be selected and passed through to the device output. Also, the original data signal is split into two parts so that each part of the signal saturates a corresponding amplifier in the interferometer simultaneously. Since the interference effect in the interferometer depends on an imbalance between the arms of the interferometer, this approach reduces the relative difference between the two arms and thereby reduces the available amount of the interference effect.

The simultaneous saturation problem is ameliorated by coupling the original data signal into the interferometer in such a way that the original data signal is confined to a single path through the semiconductor optical amplifier. The wavelength converted signal propagates through that same semiconductor optical amplifier. This embodiment ensures that the original data signal is utilized effectively to maximize the interference effect, which is required for wavelength conversion, while minimizing the problems associated with simultaneously saturating amplifiers in the interferometer structure.

The simultaneous saturation and filtering problems are jointly overcome in an interferometer including a semiconductor optical amplifier in at least one arm of the interferometer by coupling the original data signal into the interferometer so that the original data signal is confined to one path within the interferometer and propagates in a direction opposite to the wavelength converted signal through the semiconductor optical amplifier. This embodiment is also shown in a modified form to include an amplifier in each arm of the interferometer.

Shorter semiconductor optical amplifiers may be used in the interferometer to improve the speed of the converter as well as its noise performance. This is feasible when the interferometer is augmented with a pre-amplifier and a post-amplifier. The pre-amplifier is placed along the path which couples the original data signal into the interferometer; the post-amplifier is placed along the output path of the interferometer for boosting the power of the wavelength-converted signal. This embodiment is shown to be useful for readying the converter for optimum or desired operation.

In accordance with the principles of the invention, the illustrative embodiments can be monolithically integrated to include all the elements comprising the wavelength converter and even including the continuous wave source at the second wavelength.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Figure 1:
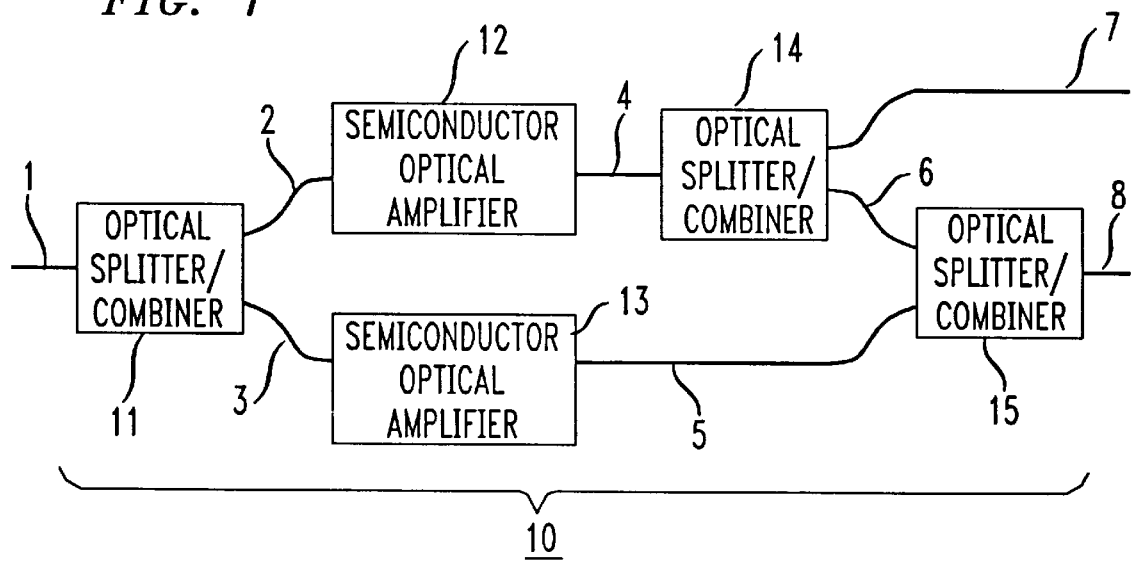
FIGS. 1, 3, 4, and 5 are block diagrams depicting various exemplary embodiments of the semiconductor interferometric optical wavelength conversion device.

An interferometric optical amplifier wavelength converter 10 is shown in FIG. 1 in block diagram form. This wavelength converter comprises an interferometer structure together with at least one semiconductor optical amplifier. Wavelength converter 10 accepts two input signals, namely, a pump signal and a probe signal. The pump signal is the information bearing lightwave signal at the first wavelength. The information is intensity modulated onto a lightwave carrier at the first wavelength. The probe signal is a continuous wave lightwave signal at the second wavelength. It is the "carrier" signal onto which the information from the pump signal will be transferred thereby effecting wavelength conversion.

The interferometer is an optical instrument which splits a lightwave into two separate waves which travel along different paths (arms) of the interferometer, delays each of the separated waves by unequal amounts, and redirects the waves to combine via superposition into a single lightwave. In FIG. 1, the interferometer structure is depicted as a Mach-Zehnder interferometer. Other types of interferometer topologies such as Michelson and Sagnac interferometers, which are well known in the art, are contemplated for use in place of the Mach-Zehnder structure.

Interferometric optical amplifier wavelength converter 10 includes waveguides 1–8, optical splitters/combiners 11, 14, and 15, and semiconductor optical amplifiers 12 and 13. It is understood that the wavelength converter can operate with only one semiconductor optical amplifier thereby rendering the use of semiconductor optical amplifier 13 optional.

Waveguides 1–8 are generally single mode waveguides. It should be noted that one or more of these waveguides can be fabricated to operate as multimode waveguides.

Figure 2:
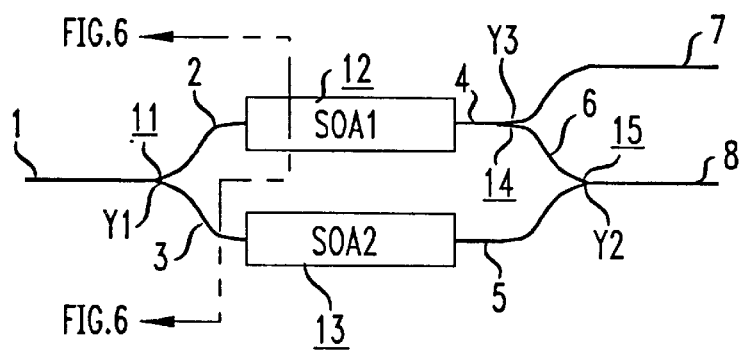
FIG. 2 is a simplified schematic diagram of an embodiment in FIG. 1 showing the waveguides and amplifier.

A semiconductor optical amplifier is positioned in each path (arm) of the interferometer. In FIG. 2, the semiconductor optical amplifiers are designated SOA1 and SOA2. While the amplifiers can be electrically connected, it is desirable in certain cases to maintain electrical isolation between the amplifiers, when both are used, thereby affording the possibility of performing individual biasing. The gain saturation effect of the optical amplifier is used to achieve wavelength conversion. When the gain of an optical amplifier is changed by one lightwave signal, there is a corresponding gain change seen by a second optical signal traveling through the same amplifier. U.S. Pat. No. 5,264,960 describes a traveling wave semiconductor optical amplifier which employs this effect to perform wavelength shifting or conversion. The teachings of this patent are expressly incorporated herein by reference.

Optical splitters/combiners 11, 14, and 15 provide the beam splitting function and its reciprocal, the beam combining function. Y-branches designated Y1, Y2, and Y3 in FIG. 2 are typical waveguide structures which perform optical beam splitting and beam combining functions. Other waveguide tap and coupler structures utilizing symmetric and asymmetric topologies are useful for realizing the beam splitting and beam combining. Of course, optical fiber devices may also be used in a hybrid realization of the wavelength converter.

Splitting ratios for each splitter/combiner may be adjusted for equal splitting (i.e., 3 dB) or some other desirable ratio. Equal splitting ratios may require an adjustment in the bias setting of the amplifier(s) to maximize the phase difference between the two separate paths of the interferometer.

The sensitivity of the wavelength converter can be increased by introducing an asymmetry in the coupling ratio of optical splitter/combiner 14 (Y3) so that a larger percentage of the pump signal is supplied to semiconductor optical amplifier 12. Such an asymmetry has the concomitant effect of reducing the amount of the probe signal supplied to the converter output.

The particular function performed by the splitter/combiner is dependent upon the direction of incident light. For example, when waveguides 1 and 7 serve as input waveguides and waveguide 8 serves as an output waveguide, optical splitters/combiners 11 and 14 perform beam splitting while optical splitter 15 performs beam combining. It should be noted that optical splitter/combiner 14 also provides a combining function for the lightwave signal input along waveguide 7. Similarly, when waveguides 7 and 8 serve as input waveguides and waveguide 1 serves as an output waveguide, optical splitters/combiners 11 and 14 perform beam combining while optical splitter 15 performs beam splitting.

Optical splitter/combiner 14 is important to the inventive wavelength converter because it provides an optical coupling means for introducing the pump signal into the interferometer so that it is confined to one path within the interferometer and propagates through the semiconductor optical amplifier with the probe signal. The pump signal can propagate co-directionally or contra-directionally with respect to the probe signal but, according to the inventive concept, the pump signal must be confined to one path (arm) of the interferometer. When the two lightwave signals (pump and probe) propagate in opposite directions through the semiconductor optical amplifier 12, the output signal in waveguide 8 sees no trace of the pump signal. In such an operating mode, there is no need for an output filter to remove the pump signal. On the other hand, when the pump and probe signals copropagate through semiconductor optical amplifier 12, an output filter may be needed in waveguide 1 to block the further transmission of the lightwave signal at the first wavelength.

In one operational embodiment of wavelength converter 10, the pump signal is introduced via waveguide 7 whereas the probe signal is introduced via waveguide 1. Y-branch 11 splits the probe signal into two parts, each of which travels through an amplifier in the corresponding path (arm) of the interferometer. The two parts of the probe signal combine with each other at Y-branch 15. Y-branch 14 accepts the pump signal and places it on waveguide 4 so that the pump signal propagates only through semiconductor optical amplifier 12 in a direction opposite to the probe signal. In semiconductor optical amplifier 12, the probe signal is modulated in amplitude and phase by the pump signal via the gain saturation effect. The resulting probe signals in waveguides 5 and 6 are combined in Y-branch 15 to create an intensity modulated probe signal. This signal is the wavelength converted output of wavelength converter 10. In this operational scheme, there is no need to filter the pump signal from the converter output because of the confinement of the pump signal to one path through the interferometer in a direction opposite to the probe signal. That is, only the wavelength converted signal (at the wavelength of the probe signal) appears at the wavelength converter output.

One simple procedure for setting bias currents for semiconductor optical amplifier 12 and semiconductor optical amplifier 13 is as follows:

1. maintain semiconductor optical amplifier 13 unbiased and set the bias current for semiconductor optical amplifier 12 at an appropriate level for which substantial gain reduction is observed for the probe signal at output 8 when the pump signal is at a high intensity state;
2. fix the pump signal at its low intensity state (for non-inverting wavelength conversion) or at its high intensity state (for inverting wavelength conversion); and
3. set the bias to semiconductor optical amplifier 13 at a level where the probe output is at a minimum.

Probe gain is defined as the ratio between the output power and input power of the probe signal. The probe gain is calculated as a function of the amplifier gains, the linewidth enhancement factors or the amplifiers, the topology of the interferometer, the coupling coefficients of the splitters/combiners, and a phase factor accounting for the path difference of the two arms of the interferometer. In order to maximize the extinction ratio of the probe signal, it is contemplated that the lower intensity state of the probe signal should correspond to the minimum probe gain. For a reasonable set of operating conditions (3 dB coupling and 20 dB gain for SOA2), the wavelength converter can be shown to have an extinction ratio of 15–20 dB for the probe signal with an amplifier gain variation between SOA1 and SOA2 of less than or equal to 5 dB.

Figure 6:
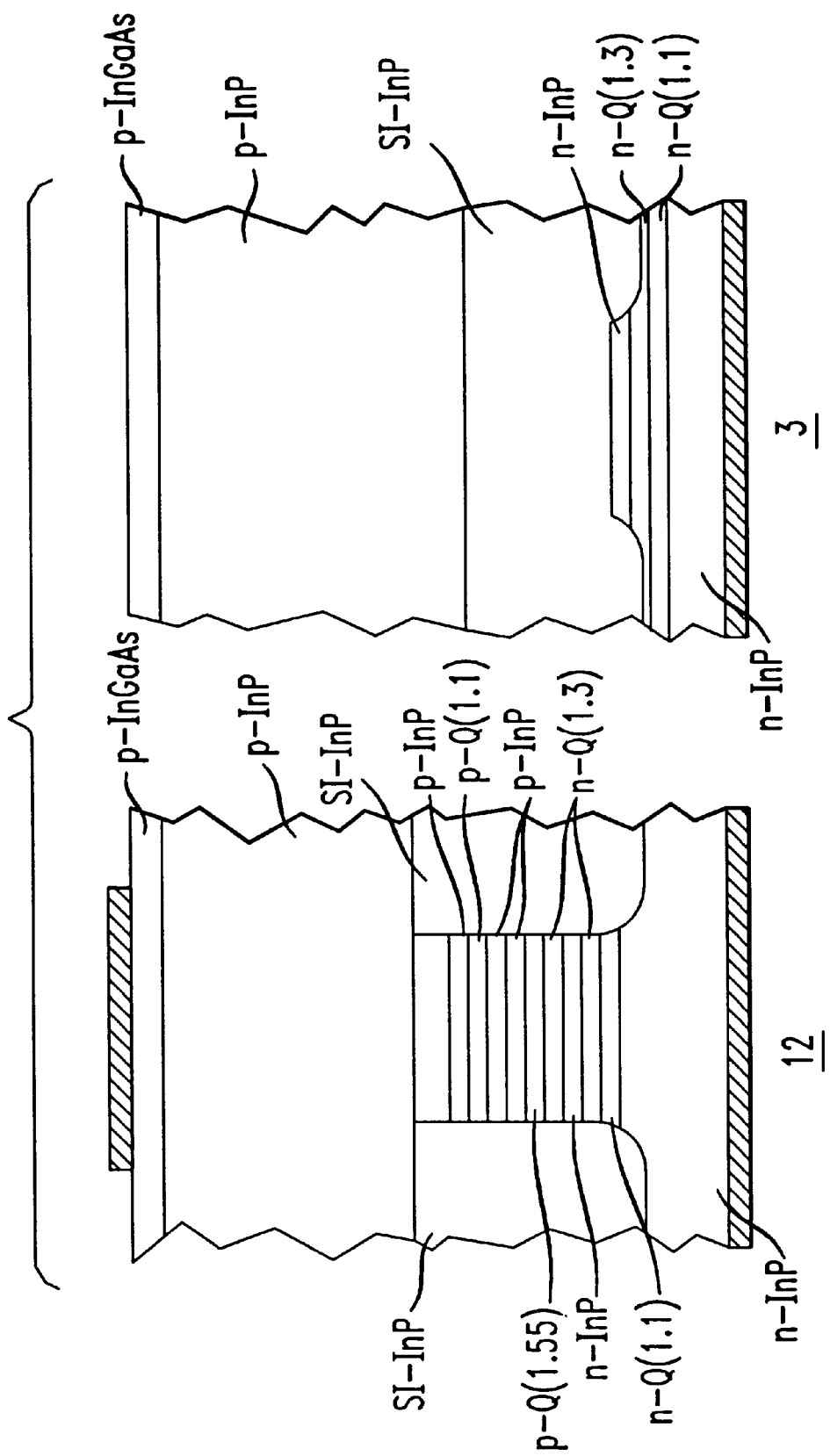
FIG. 6 shows the semiconductor heterostructure of a cross-section through one amplifier and one waveguide in FIG. 2.

The entire device shown in FIGS. 1 and 2 can be fabricated as an integrated or hybrid structure. The wavelength converter has been fabricated as an integrated semiconductor device on an InP substrate using InGaAsP/InP compounds. A cross-sectional view of exemplary amplifier and waveguide heterostructures is shown in FIG. 6 which will be described in more detail below. InP stop-etch layers were interspersed throughout the layer structure to accommodate later device processing. Growth, fabrication, and processing techniques for this general class of integrated semiconductor device are well known in the art and have been disclosed in U.S. Pat. No. 5,147,825 whose teachings are expressly incorporated herein by reference.

As described above, the present wavelength converter confines the pump signal in such a way that it saturates only one amplifier in the interferometer. This significantly improves and potentially maximizes the induced change in the phase difference between the two interferometer arms. As a result, this wavelength converter exhibits greater input sensitivity.

There can be a problem with intensity noise transferred from the pump signal to the probe signal. The problem arises from the selection of certain operating conditions. For example, when the power of the probe signal is strong enough to saturate either one of the two semiconductor optical amplifiers, there may be a significant amplification of the intensity noise of the probe signal. Obviously, intensity noise can be controlled by the selection of suitable operating conditions.

Figure 3:
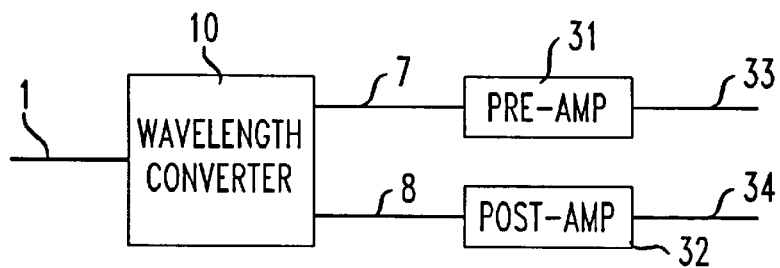

As the data rate of the pump signal increases without any change in the amplifier structure, walk-off may be encountered between counter-propagating pump and probe signals. This walk-off phenomenon will be observed unless the time required for the signals to traverse the amplifier is short with respect to the bit period. Therefore, amplifier length tends to limit the speed of operation of the wavelength converter. In order to overcome this potential problem, wavelength converter 10 can be modified to include a pre-amplifier and a post-amplifier as shown in FIG. 3. This will allow one to shorten the lengths of the semiconductor optical amplifiers in the wavelength converter and reduce walk-off problems thereby. It should be noted that this configuration also improves the noise performance of the wavelength converter.

All the elements shown in FIG. 3 can be monolithically integrated on the same substrate using the semiconductor processing techniques described above. For an integrated semiconductor device, pre-amplifier 31 and post-amplifier 32 are realized as semiconductor optical amplifiers. However, for hybrid structures, amplifiers 31 and 32 are simply to be of the type which amplify optical signals.

Pre-amplifier 31 is connected between waveguides 7 and 33 in order to provide amplification for the pump signal which is input via waveguide 33. Post-amplifier 32 is connected between waveguides 8 and 34 to amplify the converted output signal from the wavelength converter. These two amplifiers are separated electrically. Although the pre- and post-amplifiers are preferably separated electrically from each other to increase the number of degrees of freedom for picking operating bias conditions, it may be desirable to couple certain amplifiers together electrically in order to reduce the number of bias currents. For example, the pre-amplifier could be electrically coupled with semiconductor optical amplifier 12 while the post-amplifier could be electrically coupled with semiconductor optical amplifier 13.

By employing pre- and post-amplifiers with wavelength converter 10, it is possible to reduce the length of semiconductor optical amplifiers 12 and 13. The usual length for amplifiers 12 and 13 would be on the order of 1 mm. A reduced amplifier length would, in turn, decrease the possible effects of walk-off and thereby improve the potential speed of the wavelength converter. Also, by employing shorter amplifiers, it is possible to reduce the gain saturation caused by the probe signal. In turn, this reduces the amplification of intensity noise in the probe signal. The optical gain of the pre-amplifier can be adjusted to reduce the transfer of intensity noise from the pump signal to the probe signal and thus to the wavelength converted output signal.

The embodiment shown in FIG. 3 uniquely permits adjustment of all bias currents prior to operating the wavelength conversion. Pre-amplifier 31 is unbiased initially to act as an isolator and provide loss along the pump signal transmission path thereby blocking transmission of the pump signal from waveguide 33 to waveguide 7. Post-amplifier 32 is reverse biased and therefore acts as a photodetector. The detected photocurrent from this arrangement can then be used as a control signal for setting the operating bias currents for SOA1 and SOA2 using, for example, the procedure described earlier.

Figure 4:
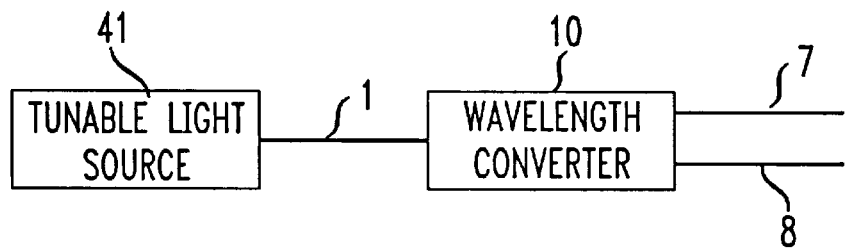

FIG. 4 shows wavelength converter 10 integrated with tunable light source 41. Tunable light source 41 is the source of the probe signal, a continuous wave lightwave signal, whose wavelength can be selected from a particular range of wavelengths. Source 41 comprises either a single wavelength tunable laser or an array of individually tuned and individually selectable lasers which provide a single output on waveguide 1. Continuous or discrete tunability is contemplated. Single wavelength tunable lasers are well known in the art and include such lasers as tunable distributed Bragg reflector lasers and tunable distributed feedback lasers. Laser arrays suitable for use, and possible monolithic integration, with the wavelength converter are described in allowed U.S. patent application Ser. No. 08/019,952 (Dragone-Kaminow Case 34-41 filed Feb. 19, 1992), allowed U.S. patent application Ser. No. 08/097,692 (Koch Case 22 filed Jul. 27, 1993), and U.S. patent application Ser. No. 08/316,614 (Zirngibl Case 11 filed Sep. 30, 1994). All the elements shown in FIG. 4 can be monolithically integrated on the same substrate using the semiconductor processing techniques described above.

Figure 5:
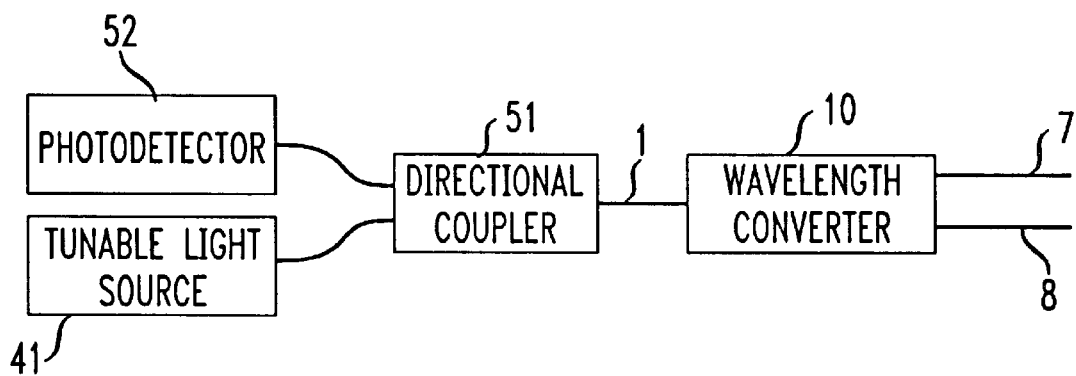

FIG. 5 shows a further improvement over the embodiment depicted in FIG. 4. In particular, FIG. 5 includes the tunable light source 41 together with a photodetector 52. Both the photodetector and light source are coupled through directional coupler 51 to wavelength converter 10 via waveguide 1. The photodetector in this embodiment can be a waveguide photodetector and is useful for monitoring the pump signal and any reflected probe signal which propagates back through the wavelength converter. The photocurrent from photodetector can be used to control the bias setting on the semiconductor optical amplifiers. All the elements shown in FIG. 5 can be monolithically integrated on the same substrate using the semiconductor processing techniques described above.

FIG. 6 shows a cross-sectional view through an exemplary semiconductor heterostructure realization of wavelength converter 10. The sectioned portions of a semiconductor optical amplifier and a waveguide are identified in FIG. 2. Semiconductor optical amplifier 12 includes metallic contacts to the p and n contact regions. The amplifiers and waveguides are formed as buried rib waveguides and are surrounded by semi-insulating (SI) semiconductor material. The embodiment shown in FIG. 6 is fabricated on an InP substrate using the InGaAsP/InP semiconductor system. There is an overgrowth of p-type InP approximately 1.25 $\mu$m thick (dopant concentration approximately $1.0 \times 10^{18}$) and a cap or contact layer of p InGaAs as shown in FIG. 6. In FIG. 6, each quaternary (Q) layer bears an indication of its nominal photoluminescence wavelength.

The semiconductor heterostructure layers for waveguide 3 are given as:

| Composition | Conductivity:Dopant | Concent. | Thickness |
|---|---|---|---|
| InP (substrate) | n:S | $3 \times 10^{17}$ | 3000Å |
| InGaAsP (1.1 $\mu$m) | n:S | $3 \times 10^{17}$ | 800Å |
| InGaAsP (1.3 $\mu$m) | n:S | $3 \times 10^{17}$ | 1000Å |
| InP | n:S | $3 \times 10^{17}$ | 250Å |

The semiconductor heterostructure layers for semiconductor optical amplifier 12 are given as:

| Composition | Conductivity:Dopant | Concent. | Thickness |
|---|---|---|---|
| metallic contact | | | |
| InP (substrate) | n:S | $3 \times 10^{17}$ | 3000Å |
| InGaAsP (1.1 $\mu$m) | n:S | $3 \times 10^{17}$ | 800Å |
| InGaAsP (1.3 $\mu$m) | n:S | $3 \times 10^{17}$ | 1000Å |
| InP | n:S | $3 \times 10^{17}$ | 250Å |
| InGaAsP (1.3 $\mu$m) | n:S | $3 \times 10^{17}$ | 400Å |
| InGaAsP (1.55 $\mu$m) | p:Zn | $3 \times 10^{17}$ | 1000Å |
| InP | p:Zn | $3 \times 10^{17}$ | 1000Å |
| InP: graded doping | p:Zn | $3 \times 10^{17} \rightarrow$ $\rightarrow 3 \times 10^{18}$ | 7000Å |
| InGaAsP (1.1 $\mu$m) | p:Zn | $1.2 \times 10^{18}$ | 250Å |
| InP | p:Zn | $1.0 \times 10^{18}$ | 100Å |

It is understood that, while the Group III–V material system InGaAsP/InP is described above for fabricating the interferometric semiconductor optical amplifier wavelength converter, other material combinations may be selected from other semiconductor Group III–V systems such as GaAs/InGaAs, InGaAs/InGaAlAs, InGaAs/InAlAs, GaAs/AlAs, GaAsSb/GaAlAsSb and AlGaAs/GaAs to realize the wavelength converter. In these semiconductor systems, the layers may be lattice-matched to suitable GaAs or InP substrates. Mismatching is also contemplated wherein strained layers are grown over the substrate material. Finally, extension of the device structures to semiconductor compounds in Group II–VI and Group IV is also contemplated.

While the present invention has been described in terms of wavelength conversion, it is apparent that this invention is applicable to the general field of information transfer from one lightwave carrier signal to another lightwave carrier signal. For example, it is contemplated that the present invention can be used in such applications as signal regeneration where the information is transferred between two lightwave carrier signals operating at the same wavelength. That is, the pump and probe signals are at the same wavelength.

What is claimed is:

1. Optical apparatus for transferring a representation of information from a first signal to a second signal, said first and second signals being lightwave signals at different wavelengths, the apparatus comprising, an interferometer including input means for coupling the second signal to the interferometer, output means for coupling a third signal from the interferometer, and at least first and second separate optical paths between said input and output means, said third signal includes the representation of information and the second signal, a semiconductor optical amplifier included in at least one of the optical paths, and optical coupling means for introducing the first signal into the interferometer so that the first signal 1) is confined to one path within the interferometer and 2) propagates in a direction opposite to the second signal through the semiconductor optical amplifier.

2. The apparatus as defined in claim 1 wherein the interferometer is selected from the group consisting of Mach-Zehnder, Michelson, and Sagnac interferometers.

3. The apparatus as defined in claim 1 wherein the semiconductor optical amplifier is included in each of the at least first and second paths of the interferometer.

4. The apparatus as defined in claim 3 wherein the interferometer and the semiconductor optical amplifiers are integrated on a single semiconductor substrate.

5. The apparatus as defined in claim 1 further including a light source of said second lightwave signal.

6. The apparatus as defined in claim 5 wherein said light source includes a plurality of lasers, each laser operating at a different wavelength, said plurality of lasers being individually selectable to supply its output lightwave signal to an output of the light source.

7. The apparatus as defined in claim 5 wherein said light source is tunable to any one of a plurality of wavelengths within a particular range of wavelengths including the second wavelength.

8. The apparatus as defined in claim 5 wherein the interferometer, the semiconductor optical amplifiers, and the light source are integrated on a single semiconductor substrate.

9. Optical apparatus responsive to first and second lightwave signals, said first and second signals being lightwave signals at different wavelengths, the apparatus comprising, an interferometer for transferring information from the first lightwave signal to the second lightwave signal, the interferometer including separate first and second optical paths, a semiconductor optical amplifier included in at least one of the optical paths, and optical coupling means for introducing the first lightwave signal into the interferometer so that the first lightwave signal is confined to one path within the interferometer and the first lightwave signal propagates in a direction opposite the second lightwave signal through the semiconductor optical amplifier, whereby the second lightwave signal alone is output by the interferometer without the use of filters to discriminate against the propagation of the first lightwave signal.

10. The apparatus as defined in claim 1 wherein the optical coupling means further includes a semiconductor optical pre-amplifier for amplifying the first signal before it is input into the interferometer.

11. The apparatus as defined in claim 1 wherein the output means further includes a semiconductor optical post-amplifier for amplifying the third signal after it is output from the interferometer.

12. The apparatus as defined in claim 10 wherein the output means further includes a semiconductor optical post-amplifier for amplifying the third signal after it is output from the interferometer.

* * * * *